United States Patent
Bojarczuk, Jr. et al.

(10) Patent No.: US 7,242,055 B2
(45) Date of Patent: Jul. 10, 2007

(54) NITROGEN-CONTAINING FIELD EFFECT TRANSISTOR GATE STACK CONTAINING A THRESHOLD VOLTAGE CONTROL LAYER FORMED VIA DEPOSITION OF A METAL OXIDE

(75) Inventors: Nestor A. Bojarczuk, Jr., Poughkeepsie, NY (US); Cyril Cabral, Jr., Mahopac, NY (US); Eduard A. Cartier, New York, NY (US); Martin M. Frank, New York, NY (US); Evgeni P. Gousev, Mahopac, NY (US); Supratik Guha, Chappaqua, NY (US); Paul C. Jamison, Hopewell Junction, NY (US); Rajarao Jammy, Hopewell Junction, NY (US); Vijay Narayanan, New York, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 10/988,733

(22) Filed: Nov. 15, 2004

(65) Prior Publication Data

US 2006/0102968 A1    May 18, 2006

(51) Int. Cl.
*H01L 29/792* (2006.01)
(52) U.S. Cl. .................. 257/324; 257/402; 257/491; 438/216; 438/287

(58) Field of Classification Search ............... 257/324, 257/325, 402, 491; 438/216, 287
See application file for complete search history.

(56) References Cited

U.S. PATENT DOCUMENTS

| | | | | |
|---|---|---|---|---|
| 6,448,127 | B1 * | 9/2002 | Xiang et al. ............... | 438/216 |
| 6,544,906 | B2 * | 4/2003 | Rotondaro et al. ......... | 438/785 |
| 6,638,877 | B2 * | 10/2003 | Rotondaro .................. | 438/770 |
| 6,787,440 | B2 * | 9/2004 | Parker et al. ............... | 438/591 |
| 6,787,451 | B2 * | 9/2004 | Shimamoto et al. ........ | 438/630 |
| 6,911,707 | B2 * | 6/2005 | Gardner et al. ............. | 257/410 |
| 6,984,565 | B2 * | 1/2006 | Kawahara ................... | 438/287 |
| 7,071,038 | B2 * | 7/2006 | Triyoso et al. ............. | 438/151 |
| 7,087,495 | B2 * | 8/2006 | Kawahara et al. .......... | 438/287 |
| 7,105,889 | B2 * | 9/2006 | Bojarczuk et al. .......... | 257/324 |

* cited by examiner

*Primary Examiner*—Fernando L. Toledo
(74) *Attorney, Agent, or Firm*—Scully, Scott, Murphy & Presser, P.C.; Robert M. Trepp, Esq.

(57) ABSTRACT

A semiconductor structure is provided that includes a $V_t$ stabilization layer between a gate dielectric and a gate electrode. The $V_t$ stabilization layer is capable of stabilizing the structure's threshold voltage and flatband voltage to a targeted value and comprises a nitrided metal oxide, or a nitrogen-free metal oxide, with the proviso that when the $V_t$ stabilization layer comprises a nitrogen-free metal oxide, at least one of the semiconductor substrate or the gate dielectric includes nitrogen. The present invention also provides a method of fabricating such a structure.

34 Claims, 4 Drawing Sheets

NITROGEN-CONTAINING FIELD EFFECT TRANSISTOR GATE STACK CONTAINING A THRESHOLD VOLTAGE CONTROL LAYER FORMED VIA DEPOSITION OF A METAL OXIDE

RELATED APPLICATIONS

This application is related to co-pending and co-assigned U.S. patent application Ser. No. 10/854,719, filed May 14, 2004 and U.S. patent application Ser. No. 10/863,830, filed Jun. 4, 2004. The entire contents of the aforementioned U.S. Patent Applications are incorporated herein by reference in their entirety.

FIELD OF THE INVENTION

The present invention generally relates to a semiconductor device, and more particular to a complementary metal oxide semiconductor field effect transistor (MOSFET) structure that includes a layer that is capable of sufficiently controlling the threshold voltage $V_t$ of the structure; this layer is referred to herein as a $V_t$ stabilization layer. The present invention also relates to a method of fabricating such a MOSFET structure.

BACKGROUND OF THE INVENTION

In standard silicon complementary metal oxide semiconductor (CMOS) technology, p-type field effect transistors (pFETs) use a boron (or other acceptor) doped p-type polysilicon layer as a gate electrode that is deposited on top of a silicon dioxide or silicon oxynitride gate dielectric layer. The gate voltage is applied through this polysilicon layer to create an inversion channel in the n-type silicon underneath the gate dielectric layer.

For a pFET to work properly, the inversion should begin occurring at slightly negative voltages applied to the polysilicon (poly-Si) gate electrode. This occurs as a consequence of the band alignment for the gate stack structure as depicted in FIG. 1. Specifically, FIG. 1 shows the approximate band alignment across a poly-Si/gate oxide gate stack in a typical pFET at zero gate bias. In FIG. 1, $E_c$, $E_v$, and $E_f$ are the conduction band edge, valence band edge and the Fermi level in the silicon, respectively. The poly-Si/gate oxide/n-type silicon stack forms a capacitor that swings into inversion at around 0 V and into accumulation around +1 V (depending on the substrate doping). The threshold voltage Vt, which can be interpreted as the voltage at which the inversion starts occurring, is therefore approximately 0 V and the flatband voltage, which is the voltage just beyond which the capacitor starts to swing into accumulation, is approximately +1 V. The exact values of the threshold and flatband voltages have a dependence on the doping level in the silicon substrate, and can be varied somewhat by choosing an appropriate substrate doping level.

In future technology, silicon dioxide or silicon oxynitride dielectrics will be replaced with a gate material that has a higher dielectric constant. These materials are known as "high k" materials with the term "high k" denoting an insulating material whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Unfortunately, when p-type field effect transistors are fabricated using a dielectric such as hafnium oxide or hafnium silicate, it is a well known problem that the flatband voltage of the device is shifted from its ideal position of close to about +1 V, to about 0 +/−300 mV. This shift in flatband voltage is published in C. Hobbs et al., entitled "Fermi Level Pinning at the Poly-Si/Metal Oxide Interface", 2003 Symposium on VLSI Technology Digest of Technical Papers. Consequently, the threshold voltage of the device is shifted to approximately −1 V. This threshold voltage shift is believed to be a consequence of an intimate interaction between the Hf-based gate oxide layer and the polysilicon layer. One model (See, for example, C. Hobbs, et al., ibid.) speculates that such an interaction causes an increase in the density of states in the silicon band gap at the polysilicon-gate oxide interface, leading to "Fermi level pinning". The threshold voltage therefore is not in the "right" place, i.e., it is too high for a useable CMOS (complementary metal oxide semiconductor) technology.

One possible solution to the above problem of threshold voltage shifting is by substrate engineering in which channel implants can be used to shift thresholds. Although substrate engineering is one possible means to stabilize threshold voltage shift, it can do so to a limited extent, which is inadequate for FETs that include a gate stack comprising a poly-Si gate electrode and a hafnium-containing high dielectric constant gate dielectric.

Another possible solution to the above problem of threshold voltage control in MOSFET has been disclosed in co-pending and co-assigned U.S. applicant Ser. Nos. 10/854,719, filed May 14, 2004 and 10/863,830, filed Jun. 4, 2004. In these two applications, a metal nitride containing material that may optionally include oxygen, such as Al(O)N, is used and it is positioned between a high k gate dielectric and a gate electrode.

In view of the above mentioned problem in threshold voltage and flatband voltage shift, it has been nearly impossible to develop a CMOS technology that is capable of stabilizing the threshold voltage and flatband voltage for such FETs. As such, a method and structure that is capable of stabilizing the threshold voltage and flatband voltage of FETs containing a gate stack is needed.

SUMMARY OF THE INVENTION

The present invention solves the above problem of threshold and flatband voltage shift by providing a $V_t$ stabilization layer between a gate dielectric and a gate electrode. The $V_t$ stabilization layer employed in the present invention is capable of preventing interaction between the gate dielectric and the gate electrode by spatial separation. Moreover, the $V_t$ stabilization layer employed in the present invention has a sufficiently high dielectric constant (on the order of about 4.0 or greater) such that there is a minimal decrease in gate capacitance (due to series capacitance effect) with its addition. The $V_t$ stabilization layer employed in the present invention may dissociate, at least partially, to provide a supply of p-type dopants in the near interfacial layer to ensure p-type behavior of the near interfacial gate electrode and it can prevent outdiffusion of impurities from the gate dielectric into the gate electrode and vice versa.

Another characteristic feature of the inventive $V_t$ stabilization layer is that it is chemically stable so that silicon cannot reduce it. In cases in which some dissociation of the inventive $V_t$ stabilization layer may occur, the inventive $V_t$ stabilization layer should not be an n-type dopant to silicon. Rather, the inventive $V_t$ stabilization layer can be either a p-type dopant or a neutral dopant so that device performance is not adversely affected. Also, the $V_t$ stabilization layer employed in the present invention should be a refractory compound that is able to withstand high temperatures (of approximately 1000° C., typical of standard CMOS processing).

$V_t$ stabilization layers that can be employed in the present invention include a metal oxide that may optionally be nitrided. In embodiments in which the metal oxide is not nitrided, it is required that at least one of the underlying gate dielectric or the semiconductor substrate include nitrogen therein. The $V_t$ stabilization layer is a thin interlayer located between the gate dielectric and the gate electrode. Typically, the $V_t$ stabilization layer has a thickness in the range from about 1 to about 25 Å, with a thickness from about 2 to about 15 Å being more typical.

$V_t$ stabilization layers similar to some of those of the present invention have been used as gate oxides themselves in the past (see for instance, L-Å. Ragnarsson, et al., "Physical and electrical properties of reactive molecular beam deposited aluminum nitride in metal-oxide-silicon structures", J. Applied Physics, 93 (2003) 3912–3919; S. Guha, et al., "High temperature stability of $Al_2O_3$ dielectrics on Si: Interfacial metal diffusion and mobility degradation", Applied Physics Letters, 81 (2002) 2956–2958; S. Skordas, et al., "Low temperature metal organic chemical vapor deposition of aluminum oxide thin films for advanced CMOS gate dielectric applications, in Silicon Materials—Processing, Characterization, and Reliability", edited by J. L. Veteran, P. S. Ho, D. O'Meara, V. Misra, 2002, p. 36; D. A. Buchanan, et al., "80 nm poly-silicon gated n-FETs with ultra-thin $Al_2O_3$ gate dielectric for ULSI applications", IEDM Technical Digest (2000) 223–226)) or as an etch stop layer (see, for example, C. S. Park, et al., "In Integrable Dual Metal Gate CMOS Process using Ultrathin Aluminum Nitride Buffer Layer", IEEE Electron Dev. Lett. 24 (2003) 298–300)).

Aluminum oxide ($Al_2O_3$) has been previously reported to be used as a material layer in between hafnium oxide and polysilicon in order to attempt to improve the uniformity of electrical properties. See, for example, D. C. Gilmer, et al., "Compatibility of Silicon Gates with Hafnium-based Gate Dielectrics", Microelectronic Engineering, Vol. 69, Issues 2–4, September 2003, pp. 138–144. Despite this teaching, the applicants have determined that when an $Al_2O_3$ layer is interposed between hafnium silicate and polysilicon, there is no sufficiently beneficial improvement in the threshold voltage unless either or both the gate dielectric or the semiconductor substrate include nitrogen.

Co-pending and co-assigned U.S. Patent Application Publication US2002/0090773 A1 describes a field effect transistor structure that includes a substrate having a source region, a drain region and a channel region therebetween, an insulating disposed over the channel region and a gate electrode disposed over the insulating layer. The insulating layer can include aluminum nitride alone, or aluminum nitride disposed over or underneath aluminum oxide, silicon dioxide, or silicon nitride. Aluminum nitride is used in this disclosure to provide a device that has a low leakage current.

Co-pending and co-assigned U.S. Patent Application Publication US2002/0190302 A1 describes a diffusion barrier for a field effect transistor which includes an insulating layer as a gate dielectric that includes nitrogen. The nitrogen can be introduced by infusion, nitridation or deposition of a nitrogen compound over an insulating layer.

In broad terms, the present invention provides a complementary metal oxide semiconductor (CMOS) structure that includes a semiconductor substrate having source and drain diffusion regions located therein, the source and drain diffusion regions are separated by a device channel; and a gate stack located on top of the device channel, said gate stack comprising a gate dielectric, a $V_t$ stabilization layer and a gate electrode, said $V_t$ stabilization layer is located between said gate dielectric and said gate electrode, is capable of stabilizing the structure's threshold voltage and flatband voltage to a targeted value and comprises a nitrided metal oxide, or a nitrogen-free metal oxide, with the proviso that when the $V_t$ stabilization layer comprises a nitrogen-free metal oxide, at least one of the semiconductor substrate or the gate dielectric includes nitrogen.

In one highly preferred embodiment of the present invention, a CMOS structure is provided that includes a semiconductor substrate having source and drain diffusion regions located therein, said source and drain diffusion regions are separated by a device channel; and a gate stack located on top of said device channel, said gate stack comprising a hafnium-containing high k gate dielectric, a nitrided aluminum oxide $V_t$ stabilization layer and a gate electrode, said nitrided aluminum oxide $V_t$ stabilization layer is located between said hafnium-containing high k gate dielectric and said gate electrode and is capable of stabilizing the structure's threshold voltage and flatband voltage to a targeted value.

In another aspect of the present invention, a method of forming a complementary metal oxide semiconductor (CMOS) structure having improved threshold voltage and flatband voltage stability is provided. The method includes the steps of providing a gate stack comprising a gate dielectric, a $V_t$ stabilization layer and a gate electrode on a semiconductor substrate, said $V_t$ stabilization layer is located between said gate dielectric and said gate electrode and comprises a nitrided metal oxide, or a nitrogen-free metal oxide, with the proviso that when the $V_t$ stabilization layer comprises a nitrogen-free metal oxide, at least one of the semiconductor substrate or the gate dielectric includes nitrogen; and applying a bias by any known technique to said gate stack, whereby said $V_t$ stabilization layer stabilizes the structure's threshold voltage and flatband voltage to a targeted value.

DETAILED DESCRIPTION OF THE INVENTION

The present invention, which provides a CMOS structure that includes a $V_t$ stabilization layer between a gate electrode and a gate dielectric that is capable of stabilizing the threshold voltage and flatband voltage of the structure, and a method of fabricating the same will now be described in more detail. It is noted that in FIGS. 2A–2D, the structure shown in each of the drawings is not drawn to scale. Also, although a single FET is shown on a semiconductor substrate, the present invention contemplates a plurality of FETs on the surface of the same substrate. The neighboring FETs can be isolated from each other by isolation regions, which are not shown in some of the drawings of the present application.

The drawings of the present invention represent an embodiment in which the inventive $V_t$ stabilization layer is used in a conventional CMOS process flow. Although illustration is made to such a process, the inventive $V_t$ stabilization layer can be used in any other type of process, such as a replacement gate process, in which a FET is formed. Thus, the process description regarding the technique used in forming the FET does not limit the present invention to only such a process. Instead, the inventive $V_t$ stabilization layer can be integrated within any other process that is capable of forming a FET, i.e., a replacement gate process, for example.

Figure 1:
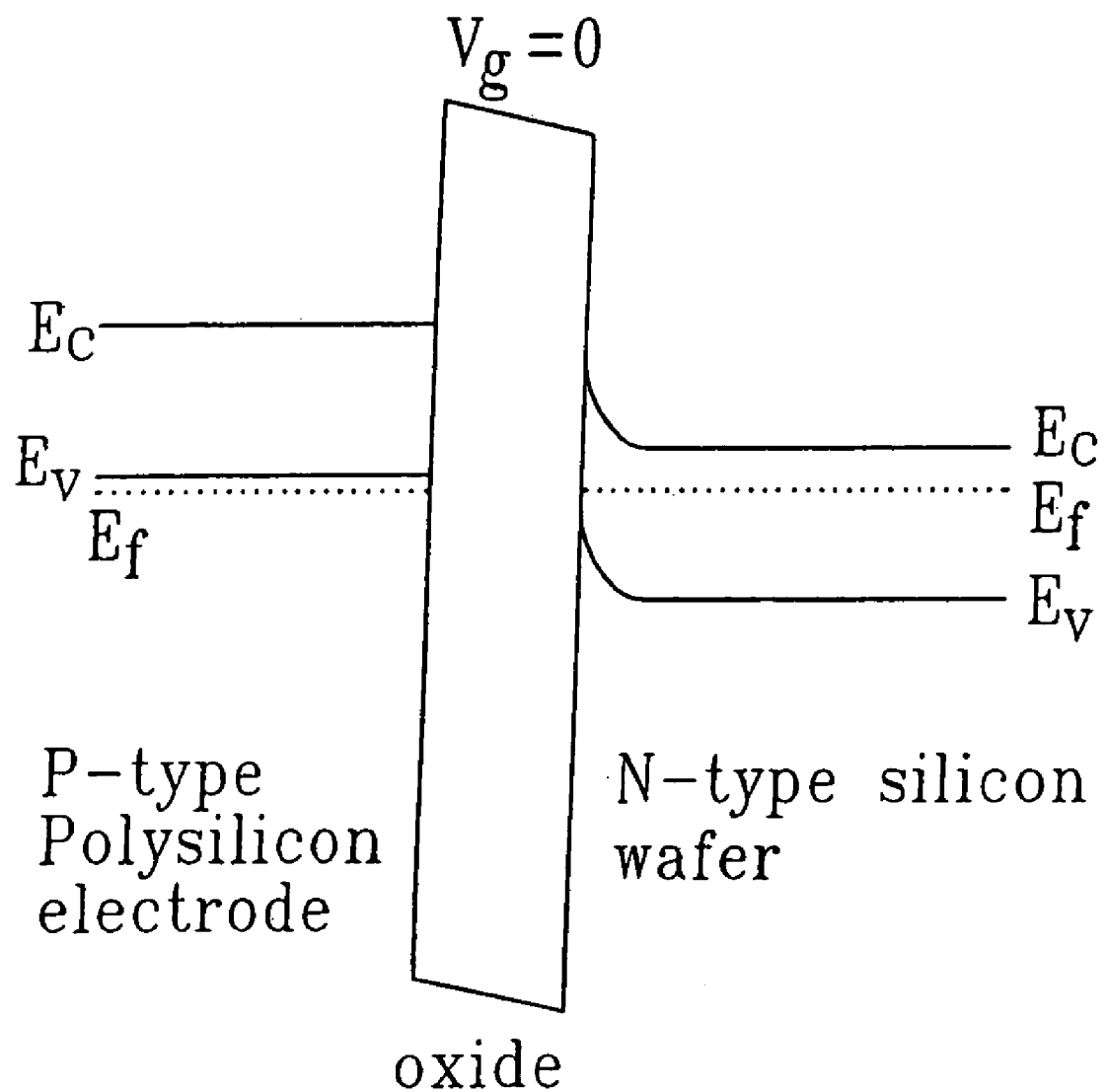
FIG. 1 is a schematic showing approximate band alignment across a prior art gate stack in a typical pFET at zero gate bias, $V_g=0$ V. The quantities $E_c$ and $E_v$ denote the conduction and the valence band edge, respectively, in the silicon substrate and in the polysilicon gate. $E_f$ denotes the Fermi level position (dotted line) in the silicon substrate and in the polysilicon gate at zero gate bias.
Figure 2A:
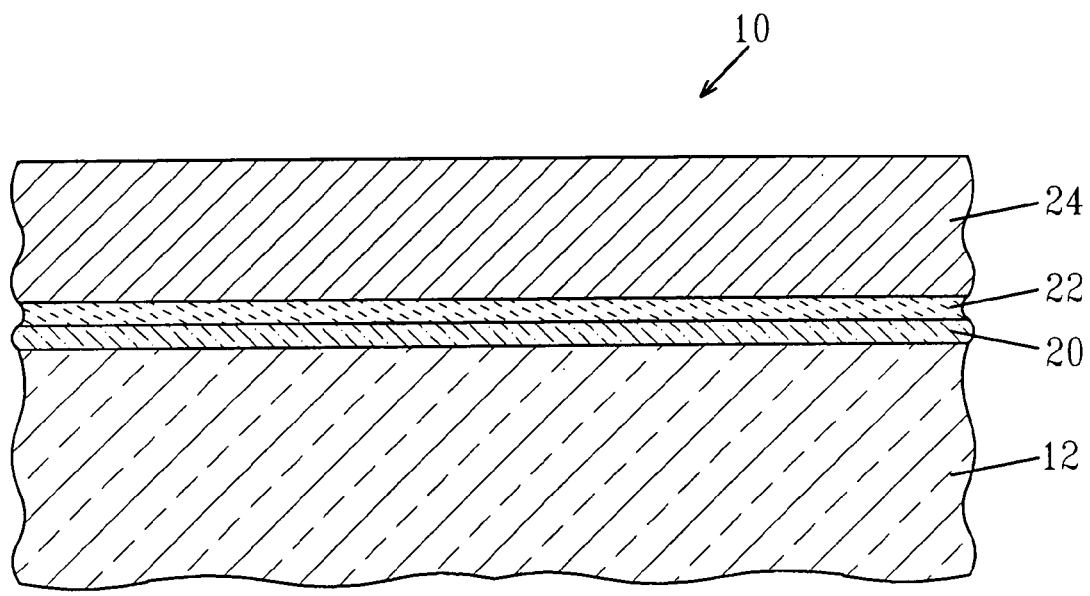
FIGS. 2A–2D are pictorial representations (through cross sectional views) of the inventive CMOS structure that includes a threshold voltage stabilization layer of the present invention located between a gate dielectric and a gate electrode through various processing steps.

Reference is first made to FIG. 2A which illustrates an initial structure 10 that can be used in the present invention. The initial structure 10 shown in FIG. 2A comprises blanket layers of a gate dielectric 20, a $V_t$ stabilization layer 22 and a gate electrode 24 on a surface of a semiconductor substrate 12. In accordance with the present invention, the $V_t$ stabilization layer 22 is located between the gate dielectric 20 and the gate electrode 24.

The semiconductor substrate 12 employed in the present invention comprises any semiconducting material including, but not limited to: Si, Ge, SiGe, SiC, SiGeC, Ga, GaAs, InAs, InP and all other IV/IV, III/V, or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells". The semiconductor substrate 12 may be strained, unstrained or a combination thereof. Moreover, the semiconductor substrate 12 may have any crystallographic orientation including, for example, 100, 110, 111 or a combination thereof.

At least one isolation region (not shown) is then typically formed into the semiconductor substrate 12. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

After forming the at least one isolation region within the semiconductor substrate 12, a gate dielectric 20 is formed on a surface of the structure. The gate dielectric 20 can be formed by a thermal growth process such as, for example, oxidation, nitridation or oxynitridation. Alternatively, the gate dielectric 20 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 20 may also be formed utilizing any combination of the above processes.

The gate dielectric 20 is comprised of an inorganic insulating material such as $SiO_2$. In some embodiments, the gate dielectric 20 is comprised of an insulating material having a dielectric constant of greater than about 4.0, preferably greater than 7.0. Specifically, the gate dielectric 20 employed in the present invention includes, but is not limited to: an oxide, nitride, oxynitride, and/or silicate (including metal silicates and nitrided metal silicates). In one embodiment, it is preferred that the gate dielectric 20 is comprised of an oxide having a high k such as, for example, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of the high k gate dielectric 20 include $HfO_2$, hafnium silicate or hafnium silicon oxynitride. Alternatively, the gate dielectric 20 may include any insulating material whose dielectric constant is below the aforementioned high k range. The gate dielectric 20 may comprise $SiO_2$, for example.

The physical thickness of the gate dielectric 20 may vary, but typically, the gate dielectric 20 has a thickness from about 0.5 to about 10 nm, with a thickness from about 0.5 to about 3 nm being more typical. It may be deposited above a thin (on the order of about 0.1 to about 1.5 nm) layer of silicon oxide or silicon oxynitride that is first deposited on the substrate.

Next, the $V_t$ stabilization layer 22 is formed atop the blanket layer of the gate dielectric 20. As stated above, the $V_t$ stabilization layer 22 employed in the present invention has at least one of the following characteristics: (i) it is capable of preventing interaction between the gate dielectric 20 and the gate electrode 24 by spatial separation; (ii) it has a sufficiently high dielectric constant (on the order of about 4.0 or greater) such that there is a minimal decrease in gate capacitance (due to series capacitance effect) because of its addition; (iii) it may dissociate, at least partially, to provide a supply of p-type dopants in the near interfacial layer to ensure p-type behavior of the near interfacial the gate electrode material; (iv) it can prevent outdiffusion of atoms from the gate dielectric 20 into the gate electrode 24; and (v) it can prevent later oxidation under the gate electrode 24.

The $V_t$ stabilization layer 22 of the present invention is a chemical interlayer that prevents interaction between the gate dielectric 20 and the gate electrode 24. The $V_t$ stabilization layer 22 of the present invention is substantially non-reactive (there may be slight or partial decomposition, such as when its acts as a dopant source) with the underlying gate dielectric 20. Another characteristic feature of the inventive $V_t$ stabilization layer 22 is that silicon cannot reduce the inventive $V_t$ stabilization layer 22. In cases in which some dissociation of the inventive $V_t$ stabilization layer 22 may occur, the inventive $V_t$ stabilization layer 22 should be either a p-type dopant or a neutral dopant so that device performance is not adversely affected. Also, the $V_t$ stabilization layer 22 employed in the present invention should be a refractory compound that is able to withstand high temperatures (of approximately 1000° C., typical of standard CMOS processing).

The $V_t$ stabilization layer 22 comprises a nitrided metal oxide, or a nitrogen-free metal oxide. When the $V_t$ stabilization layer 22 comprises a nitrogen-free metal oxide, at least one of the semiconductor substrate 12 or the gate dielectric 20 includes nitrogen. The incorporation of nitrogen into the semiconductor substrate 12 typically occurs prior to forming the blanket layers thereon. Ion implantation, gas phase doping, or a nitridation process can be used to provide nitrogen into the semiconductor substrate 12. When the gate dielectric 20 includes nitrogen, a nitrogen-containing gate dielectric 20 can be deposited or nitrogen can be introduced into the gate dielectric 20 by utilizing one of the above mentioned techniques that can be used to incorporate nitrogen into the semiconductor substrate 12.

When the $V_t$ stabilization layer 22 is a nitrided metal oxide, a metal oxide is typically formed first via a conventional deposition process and then the metal oxide is nitrided by plasma nitridation. Alternatively, the metal oxide can be nitrided by introducing excited atomic or molecular nitrogen or nitrogen-containing molecules or radicals into the metal oxide layer using ion implantation or gas phase doping.

In accordance with the present invention, the $V_t$ stabilization layer 22 thus includes a metal oxide such as, for example, aluminum oxide ($Al_2O_3$), boron oxide ($B_xO_y$), gallium oxide ($Ga_xO_y$), indium oxide ($In_xO_y$), and nitrided derivates thereof. In one preferred embodiment of the present invention, the $V_t$ stabilization layer 22 is $Al_2O_3$ or nitrided $Al_2O_3$.

The $V_t$ stabilization layer 22 is a thin layer that typically has a thickness from about 1 to about 25 Å, with a thickness from about 2 to about 15 Å being more typical.

The $V_t$ stabilization layer 22 may be amorphous meaning that it can lack a specific crystal structure. The $V_t$ stabilization layer 22 may exist in other phases besides amorphous depending on the material used as well as the technique that is used in forming the same.

In one particularly preferred embodiment, the $V_t$ stabilization layer 22 formed in the present invention is a continuous and uniform layer that is present atop the gate dielectric 20. By "continuous", it is meant that the $V_t$ stabilization layer 22 contains no substantial breaks and/or voids therein; by "uniform" it is meant that the $V_t$ stabilization layer 22 has nearly the same, as deposited, thickness across the structure.

After forming the $V_t$ stabilization layer 22, a blanket layer of a gate electrode material is formed on the $V_t$ stabilization layer 22 utilizing a known deposition process such as, for example, physical vapor deposition, CVD, sputtering or evaporation. The gate electrode 24 includes a Si-containing material, a conductive metal or metal alloy, a metal silicide, a metal nitride or combinations thereof. Preferably, the gate electrode 24 comprises a Si-containing material such as polysilicon, SiGe and SiGeC. The Si-containing material used in forming the gate conductor 24 is in either single crystal, polycrystalline or amorphous form, or consists of mixtures of such forms.

The gate electrode 24 may be doped or undoped. If doped, an in-situ doping deposition process may be employed in forming the same. Alternatively, a gate conductor 24 can be formed by deposition, ion implantation and annealing. The doping of the gate electrode 24 shifts the workfunction of the gate conductor formed. Illustrative examples of dopant ions include As, P, B, Sb, Bi, In, Al, Ga, or mixtures thereof. The thickness, i.e., height, of the gate electrode 24 deposited at this point of the present invention may vary depending on the deposition process employed. Typically, the gate electrode 24 has a vertical thickness from about 20 to about 180 nm, with a thickness from about 40 to about 150 nm being more typical.

After deposition of the blanket layer of gate electrode 24, a dielectric cap layer (not shown) can be formed atop the blanket layer of the gate electrode 24 utilizing a deposition process such as, for example, physical vapor deposition or chemical vapor deposition. The dielectric cap layer may be an oxide, nitride, oxynitride or any combination thereof. The thickness, i.e., height, of the dielectric cap layer is from about 20 to about 180 nm, with a thickness from about 30 to about 140 nm being more typical.

Figure 2B:
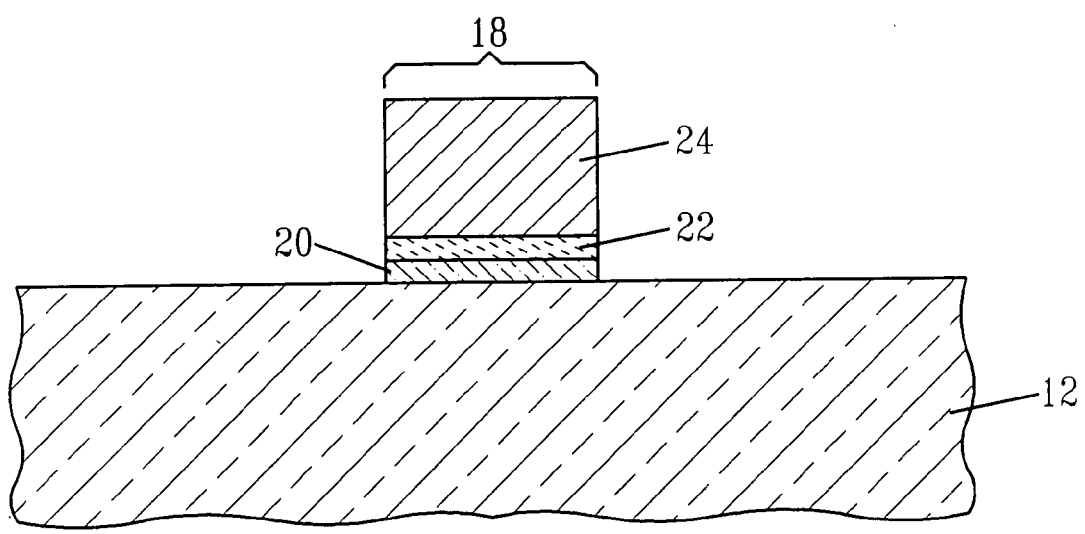

In the processing embodiment illustrated, the dielectric cap (if present), the blanket gate conductor 24, and optionally the $V_t$ stabilization layer 22 and the gate dielectric 20 are then patterned by lithography and etching so as to provide a patterned gate stack 18. When a plurality of patterned gate stacks are formed, the gate stacks may have the same dimension, i.e., length, or they can have variable dimensions to improve device performance. Each patterned gate stack 18 at this point of the present invention includes at least the gate electrode 24. FIG. 2B shows the structure after pattern gate stack formation. In the illustrated embodiment, the gate electrode 24, the $V_t$ stabilization layer 22, and the gate dielectric 20 are etched during this step of the present invention.

The lithographic step includes applying a photoresist to the upper surface of the blanket layered structure, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically, but not always, selective to the underlying gate dielectric 20 therefore this etching step does not typically remove the gate dielectric. In some embodiments, this etching step may however be used to remove portions of the gate dielectric 20 that are not protected by the material layers of the gate stack that were previously etched.

Figure 2C:
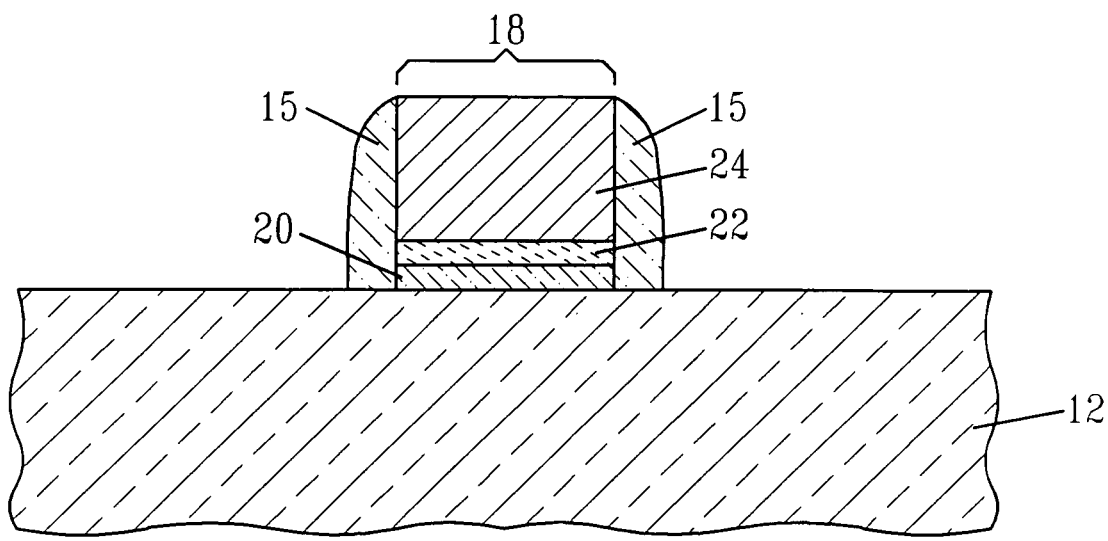

Next, at least one spacer 15 is typically, but not always, formed on exposed sidewalls of each patterned gate stack, see, for example, FIG. 2C. The at least one spacer 15 is comprised of an insulator such as an oxide, nitride, oxynitride and/or any combination thereof. The at least one spacer 15 is formed by deposition and etching.

The width of the at least one spacer 15 must be sufficiently wide such that the source and drain silicide contacts (to be subsequently formed) do not encroach underneath the edges of the gate stack 18. Typically, the source/drain silicide does not encroach underneath the edges of the gate stack 18 when the at least one spacer 15 has a width, as measured at the bottom, from about 20 to about 80 nm.

The gate stack 18 can also be passivated at this point of the present invention by subjecting the same to a thermal oxidation, nitridation or oxynitridation process. The passivation step forms a thin layer of passivating material about the gate stack. This step may be used instead or in conjunction with the previous step of spacer formation. When used with the spacer formation step, spacer formation occurs after the gate stack passivation process.

Figure 2D:
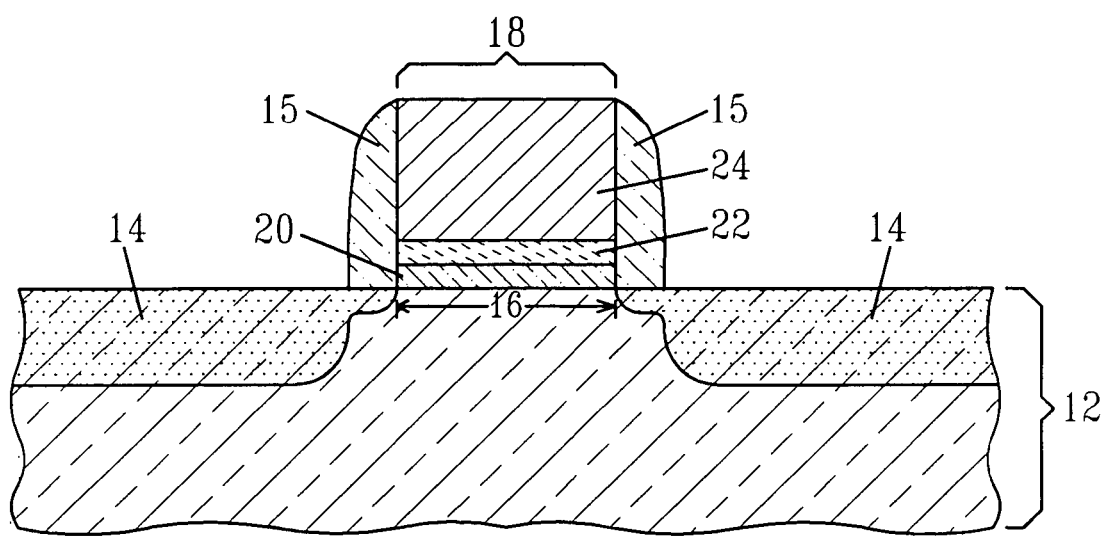

Source/drain diffusion regions 14 (with or without the spacers present) are then formed into the substrate. The source/drain diffusion regions 14 are formed utilizing ion implantation and an annealing step. The annealing step serves to activate the dopants that were implanted by the previous implant step. The conditions for the ion implantation and annealing are well known to those skilled in the art. The structure formed after ion implantation and annealing is shown in FIG. 2D.

The source/drain diffusion regions 14 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

Next, and if not previously removed, the exposed portion of the gate dielectric 20 is removed utilizing a chemical etching process that selectively removes the gate dielectric 20. This etching step stops on an upper surface of the semiconductor substrate 12. Although any chemical etchant may be used in removing the exposed portions of the gate dielectric 20, in one embodiment dilute hydrofluoric acid (DHF) is used.

Of the various combinations and embodiments described above, a particular preferred CMOS structure of the present invention is one in which the gate dielectric 20 is comprised of $HfO_2$, hafnium silicate or hafnium silicon oxynitride and the $V_t$ stabilization layer 22 is comprised of nitrided $Al_2O_3$. The particularly preferred structure also includes a boron doped poly-Si gate conductor 24. Other variations and permutations of the particularly preferred structure are also contemplated herein and should not be excluded.

Reference is again made to FIG. 2D, which is a pictorial representation (through a cross sectional view) showing the CMOS structure of the present invention. Specifically, the CMOS structure includes a semiconductor substrate 12, source/drain diffusion regions 14 located in the semiconductor substrate 12, which are separated from each other by device channel 16, and a gate stack 18 comprising a gate dielectric 20 located atop the device channel 16, a $V_t$ stabilization layer 22 located atop the gate dielectric 20 and a Si-containing gate conductor 24 located atop the $V_t$ stabilization layer 22.

The above processing steps form the CMOS structure shown in FIG. 2D. Further CMOS processing such as formation of silicided contacts (source/drain and gate) as well as formation of BEOL (back-end-of-the-line) interconnect levels with metal interconnects can be formed utilizing processing steps that are well known to those skilled in the art.

It is again emphasized that the above processing describes one technique for fabricating a FET including the inventive $V_t$ stabilization. The present invention also contemplates other techniques for fabricating a FET such as a replacement gate process in which the inventive $V_t$ stabilization layer can be used. In the other techniques for making the FET, a nitrided metal oxide as described above can be used as the $V_t$ stabilization or a nitrogen-free metal oxide is used as the $V_t$ stabilization layer and at least one of the gate dielectric or the substrate includes nitrogen therein.

In addition to the process described above, the method described in co-pending and co-assigned U.S. patent application Ser. No. 10/863,830, filed Jun. 4, 2004, which was previously incorporated herein by reference can be used to provide a structure having NFET and pFET device regions wherein the $V_t$ stabilization layer 22 is only incorporated into the pFET device region without being incorporated into the NFET device region.

The method for forming such a semiconductor structure includes providing a semiconducting substrate having a first device region and a second device region; forming a dielectric stack atop the semiconducting substrate including the first device region and the second device region, the dielectric stack comprises a $V_t$ stabilization layer atop a gate dielectric; removing the $V_t$ stabilization layer from the first device region, without removing the $V_t$ stabilization layer from the second device region; forming a gate conductor atop the $V_t$ stabilization layer in the second device region and the gate dielectric in the first device region; and etching the gate conductor, $V_t$ stabilization layer and the gate dielectric to provide at least one gate stack in the second device region and at least one gate stack in the first device region. The first device region is the area in which nFET devices are formed, while the second device region is the area in which pFET devices are formed.

Figure 3:
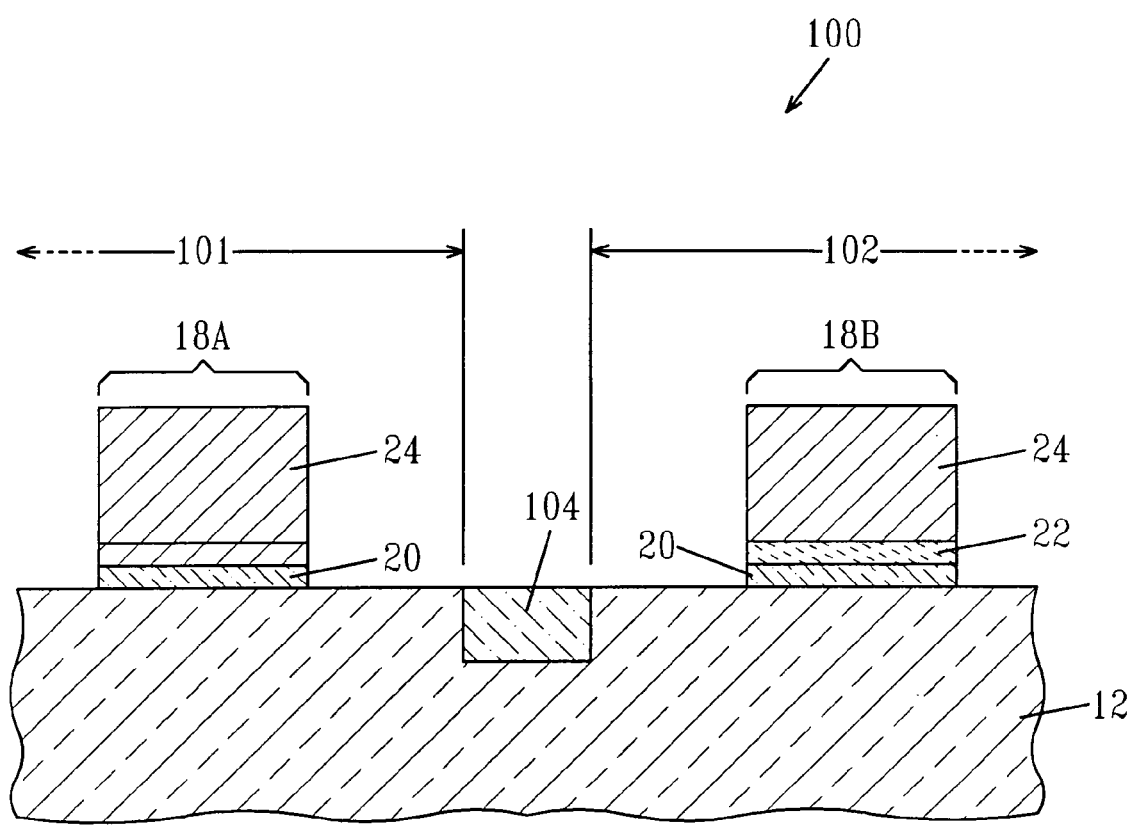
FIG. 3 is a pictorial representation (through a cross sectional view) illustrating a semiconductor structure having nFET and pFET device regions wherein the inventive $V_t$ stabilization layer is located only within the pFET device region, while not being located within the NFET device region.

The result structure is shown in FIG. 3. The structure 100 includes a semiconductor substrate 12 having a first device region 101 and a second device region 102 which are separated by an isolation region 104. The first device region 101 includes at least one first gate stack 18A comprising a first gate dielectric 20 and a first gate electrode 24. The second device region 102 includes at least one second gate stack 18B comprising a second gate dielectric 20, a $V_t$ stabilization layer 22 atop the gate dielectric 20, and a second gate conductor 24 atop the stabilization layer 22. In this embodiment, the $V_t$ stabilization layer is capable of stabilizing the second device region's threshold voltage and flatband voltage without shifting said first device region's threshold voltage and flatband voltage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a semiconductor substrate having source and drain diffusion regions located therein, the source and drain diffusion regions are separated by a device channel; and a gate stack located on top of the device channel, said gate stack comprising a gate dielectric, a $V_t$ stabilization layer and a gate electrode, said $V_t$ stabilization layer is located between said gate dielectric and said gate electrode, is capable of stabilizing the structure's threshold voltage and flatband voltage to a targeted value and comprises a nitrogen-free metal oxide, with the proviso that at least one of the semiconductor substrate and the gate dielectric includes nitrogen.

2. The semiconductor structure of claim 1 wherein said semiconductor substrate comprises Si, Ge, SiGe, SiC, SiGeC, Ga, GaAs, InAs, InP, other IV/IV, III/V or II/VI compound semiconductors, organic semiconductors or layered semiconductors.

3. The semiconductor structure of claim 1 wherein said semiconductor substrate comprises Si, SiGe, a silicon-on-insulator or a silicon germanium-on-insulator.

4. The semiconductor structure of claim 1 wherein said gate dielectric comprises at least one inorganic insulating material.

5. The semiconductor structure of claim 1 wherein said gate dielectric is a high k material comprising $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO, silicates, nitrides or nitrided silicates, or mixtures or multilayers of such materials.

6. The semiconductor structure of claim 1 wherein said nitrogen-free metal oxide comprises $Al_2O_3$, boron oxide ($B_xO_y$), gallium oxide ($Ga_xO_y$) or indium oxide ($In_xO_y$).

7. The semiconductor structure of claim 1 wherein said $V_t$ stabilization layer has a thickness from about 1 to about 25 Å.

8. The semiconductor structure of claim 1 wherein said gate electrode comprises a Si-containing material, a metal or metal alloy, a metal silicide, a metal nitride or combinations thereof.

9. The semiconductor structure of claim 8 wherein said gate electrode is a Si-containing material selected from the group consisting of polySi, SiGe and SiGeC.

10. A semiconductor structure comprising:
a semiconductor substrate having a first device region and a second device region, said first device region includes at least one first gate stack comprising a first gate dielectric and a first gate electrode, said second device region includes at least one second gate stack comprising a second gate dielectric, a $V_t$ stabilization layer atop the second gate dielectric, and a second gate conductor atop the $V_t$ stabilization layer, wherein said $V_t$ stabilization layer comprises a nitrogen-free metal oxide, with the proviso that, at least one of the semiconductor substrate and the second gate dielectric includes nitrogen.

11. The semiconductor structure of claim 10 wherein said semiconductor substrate comprises Si, Ge, SiGe, SiC, SiGeC, Ga, GaAs, InAs, InP, other IV/IV, III/V, or II/VI compound semiconductors, organic semiconductors or layered semiconductors.

12. The semiconductor structure of claim 10 wherein said semiconductor substrate comprises Si, SiGe, a silicon-on-insulator or a silicon germanium-on-insulator.

13. The semiconductor structure of claim 10 wherein said first and second gate dielectric comprise an inorganic insulating material.

14. The semiconductor structure of claim 10 wherein said first and second gate dielectrics comprise $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO, silicates, nitrides or nitrided silicates, or mixtures or multilayers of such materials.

15. The semiconductor structure of claim 10 wherein said nitrogen-free metal oxide comprises $Al_2O_3$, boron oxide ($B_xO_y$), gallium oxide ($Ga_xO_y$) or indium oxide ($In_xO_y$).

16. The semiconductor structure of claim 10 wherein said $V_t$ stabilization layer has a thickness from about 1 to about 25 Å.

17. The semiconductor structure of claim 10 wherein said gate electrode comprises a Si-containing material, a metal or metal alloy, a metal silicide, a metal nitride or combinations thereof.

18. The semiconductor structure of claim 17 wherein said gate electrode is a Si-containing material selected from the group consisting of polySi, SiGe and SiGeC.

19. A method of forming a semiconductor structure comprising:
providing a gate stack comprising a gate dielectric, a $V_t$ stabilization layer and a gate electrode on a semiconductor substrate, said $V_t$ stabilization layer is located between said gate dielectric and said gate electrode and comprises a nitrogen-free metal oxide, with the proviso that at least one of the semiconductor substrate and the gate dielectric includes nitrogen; and applying a bias to said gate stack, wherein said $V_t$ stabilization layer stabilizes the structure's threshold voltage and flatband voltage to a targeted value.

20. The method of claim 19 wherein said providing said gate stack comprises depositing blanket layers of said gate dielectric, said $V_t$ stabilization layer and said gate electrode atop said semiconductor substrate.

21. The method of claim. 19 wherein after providing said gate stack, source and drain diffusion regions are formed in said semiconductor substrate abutting the gate stack.

22. The method of claim 19 wherein said nitrogen is introduced into at least one of the semiconductor substrate and the gate dielectric by ion implantation, gas phase doping, or nitridation.

23. The method of claim 19 wherein said nitrogen-free metal oxide comprises $Al_2O_3$, boron oxide ($B_xO_y$), gallium oxide ($Ga_xO_y$) or indium oxide ($In_xO_y$).

24. The method of claim 19 wherein said $V_t$ stabilization layer has a thickness from about 1 to about 25 Å.

25. The method of claim 19 wherein said gate electrode comprises a Si-containing material, a metal or metal alloy, a metal silicide, a metal nitride or combinations thereof.

26. The method of claim 25 wherein said gate electrode is a Si-containing material selected from the group consisting of polySi, SiGe and SiGeC.

27. A method of forming a semiconductor structure comprising:
providing a semiconductor substrate having a first device region and a second device region;
forming a dielectric stack atop said semiconductor substrate including said first device region and said second device region, said dielectric stack comprising a $V_t$ stabilization layer atop a gate dielectric, said $V_t$ stabilization layer comprises a nitrogen-free metal oxide, with the proviso that at least one of the semiconductor substrate and the gate dielectric includes nitrogen;
removing said $V_t$ stabilization layer from said first device region, without removing said $V_t$ stabilization layer from said second device region;
forming a gate conductor atop said $V_t$ stabilization layer in said second device region and said gate dielectric in said first device region; and etching said gate conductor, said $V_t$ stabilization layer and said gate dielectric to provide at least one gate stack in said second device region and at least one gate stack in said first device region.

28. The method of claim 27 wherein said providing said dielectric stack comprises depositing blanket layers of said gate dielectric and said $V_t$ stabilization layer.

29. The method of claim 27 wherein removing said $V_t$ stabilization layer from said first device region comprising applying a block mask to said second device region and etching.

30. The method of claim 27 wherein said nitrogen is introduced into at least one of the semiconductor substrate and the gate dielectric by ion implantation, gas phase doping, or nitridation.

31. The method of claim 27 wherein said nitrogen-free metal oxide comprises $Al_2O_3$, boron oxide ($B_xO_y$), gallium oxide ($Ga_xO_y$) or indium oxide ($In_xO_y$).

32. The method of claim 27 wherein said $V_t$ stabilization layer has a thickness from about 1 to about 25 Å.

33. The method of claim 27 wherein said gate electrode comprises a Si-containing material, a metal or metal alloy, a metal suicide, a metal nitride or combinations thereof.

34. The method of claim 33 wherein said gate electrode is a Si-containing material selected from the group consisting of polySi, SiGe and SiGeC.

* * * * *